(12) United States Patent
Riordon et al.

(10) Patent No.: US 8,765,583 B2
(45) Date of Patent: Jul. 1, 2014

(54) ANGLED MULTI-STEP MASKING FOR PATTERNED IMPLANTATION

(75) Inventors: Benjamin Riordon, Newburyport, MA (US); Nicholas Bateman, Reading, MA (US); Atul Gupta, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 171 days.

(21) Appl. No.: 13/029,840

(22) Filed: Feb. 17, 2011

(65) Prior Publication Data

US 2012/0214273 A1 Aug. 23, 2012

(51) Int. Cl.
*H01L 21/331* (2006.01)
*H01L 21/425* (2006.01)
*H01L 21/265* (2006.01)

(52) U.S. Cl.
USPC ........... 438/525; 438/514; 438/519; 438/527; 438/369; 438/373; 257/E21.345

(58) Field of Classification Search
USPC .................................................. 257/E21.345
See application file for complete search history.

(56) References Cited

U.S. PATENT DOCUMENTS

2009/0029535 A1* 1/2009 Okai .............................. 438/525
2010/0059362 A1 3/2010 Anella
2011/0039367 A1 2/2011 Bateman et al.

* cited by examiner

*Primary Examiner* — Mohsen Ahmadi

(57) ABSTRACT

An improved method of tilting a mask to perform a pattern implant of a substrate is disclosed. The mask has a plurality of apertures, and is placed between the ion source and the substrate. The mask and substrate are tilted at a first angle relative to the incoming ion beam. After the substrate is exposed to the ion beam, the mask and substrate are tilted at a second angle relative to the ion beam and a subsequent implant step is performed. Through the selection of the aperture size and shape, the cross-section of the mask, the distance between the mask and the substrate and the number of implant steps, a variety of implant patterns may be created. In some embodiments, the implant pattern includes heavily doped horizontal stripes with lighter doped regions between the stripes. In some embodiments, the implant pattern includes a grid of heavily doped regions.

10 Claims, 11 Drawing Sheets

ANGLED MULTI-STEP MASKING FOR PATTERNED IMPLANTATION

FIELD

This invention relates to ion implantation through a mask and, more particularly, to a method of tilting a mask to perform a patterned implant of a substrate.

BACKGROUND

Ion implantation is a standard technique for introducing conductivity-altering impurities into substrates. A desired impurity material is ionized in an ion source, the ions are accelerated to form an ion beam of prescribed energy, and the ion beam is directed at the surface of the substrate. The energetic ions in the beam penetrate into the bulk of the substrate material and are embedded into the crystalline lattice of the substrate material to form a region of desired conductivity.

Solar cells provide pollution-free, equal-access energy using a free natural resource. Due to environmental concerns and rising energy costs, solar cells, which may be composed of silicon substrates, are becoming more globally important. Any reduced cost to the manufacture or production of high-performance solar cells or any efficiency improvement to high-performance solar cells would have a positive impact on the implementation of solar cells worldwide. This will enable the wider availability of this clean energy technology.

Doping may improve efficiency of solar cells. FIG. 1 is a cross-sectional view of a selective emitter solar cell 210. It may increase efficiency (e.g. the percentage of power converted and collected when a solar cell is connected to an electrical circuit) of a solar cell 210 to dope the emitter 200 and provide additional dopant to the regions 201 under the contacts 202. More heavily doping the regions 201 improves conductivity and having less doping between the contacts 202 improves charge collection. The contacts 202 may only be spaced approximately 2-3 mm apart. The regions 201 may only be approximately 100-300 µm across. FIG. 2 is a cross-sectional view of an interdigitated back contact (IBC) solar cell 220. In the IBC solar cell, the junction is on the back of the solar cell 220. The doping pattern is alternating p-type and n-type dopant regions in this particular embodiment. The p+ emitter 203 and the n+ back surface field 204 may be doped. This doping may enable the junction in the IBC solar cell to function or have increased efficiency.

In the past, solar cells have been doped using a dopant-containing glass or a paste that is heated to diffuse dopants into the solar cell. This does not allow precise doping of the various regions of the solar cell and, if voids, air bubbles, or contaminants are present, non-uniform doping may occur. Solar cells could benefit from ion implantation because ion implantation allows precise doping of the solar cell. Ion implantation of solar cells, however, may require a certain pattern of dopants or that only certain regions of the solar cell substrate are implanted with ions. Previously, implantation of only certain regions of a substrate has been accomplished using photoresist and ion implantation. Use of photoresist, however, would add an extra cost to solar cell production because extra process steps are involved. Other hard masks on the solar cell surface likewise are expensive and require extra steps.

Implanting a substrate through a mask, such as a shadow or proximity mask, has drawbacks. First, the throughput of the ion implanter is reduced if the substrate is implanted through a mask because some of the ion beam is blocked. Second, masks are difficult to cost-effectively manufacture, especially with small aperture sizes. Third, the mask itself may be fragile due to the size of the apertures. If supports or solid mask portions between the apertures weaken, then the aperture may not align to the desired regions of the substrate. Poor implant region placement, poor dimensional tolerance, thermal expansion, or damage to the mask may result during implantation. Fourth, the use of a mask produces regions of two doses: a first region having the implant dose and a second region having zero dose. It may be desirable to have a more variable level of dosing in alternating striped patterns for some applications. However, to do a blanket implant across an entire face of a substrate and then a selective implant using a mask requires repositioning of either the mask or substrate. This reduces throughput of the implanter, adds complexity to the implanter, and reduces the fidelity of the implant pattern. Accordingly, there is a need in the art for an improved method of implanting through a mask and, more particularly, a method of moving a mask to perform a patterned implant of a substrate.

SUMMARY

An improved method of tilting a mask to perform a pattern implant of a substrate is disclosed. The mask has a plurality of apertures, and is placed in the path of the ion beam, between the ion source and the substrate. The mask and substrate are tilted at a first angle relative to the incoming ion beam. After the substrate is exposed to the ion beam, the mask and substrate are tilted at a second angle relative to the ion beam and a subsequent implant step is performed. Through the selection of the aperture size and shape, the cross-section of the mask, the distance between the mask and the substrate and the number of implant steps, a variety of implant patterns may be created. In some embodiments, the implant pattern includes heavily doped horizontal stripes with lighter doped regions between the stripes. In some embodiments, the implant pattern includes a grid of heavily doped regions.

BRIEF DESCRIPTION OF THE DRAWINGS

For a better understanding of the present disclosure, reference is made to the accompanying drawings, which are incorporated herein by reference and in which.

DETAILED DESCRIPTION

Embodiments of this system are described herein in connection with solar cells. However, the embodiments of this system can be used with, for example, semiconductor substrates, light emitting diodes, or flat panels. Thus, the invention is not limited to the specific embodiments described below.

Figure 1:
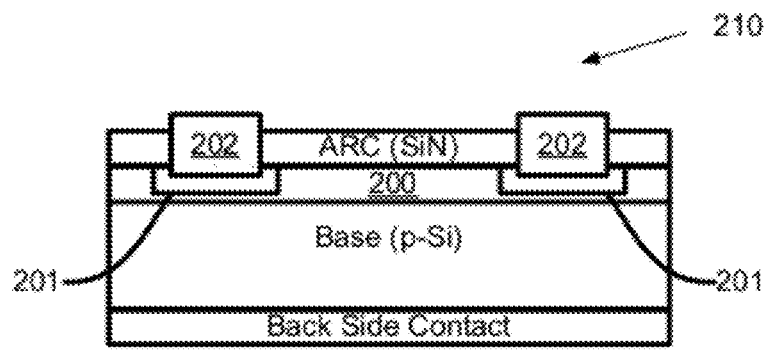
FIG. 1 is a cross-sectional view of a selective emitter solar cell.
Figure 2:
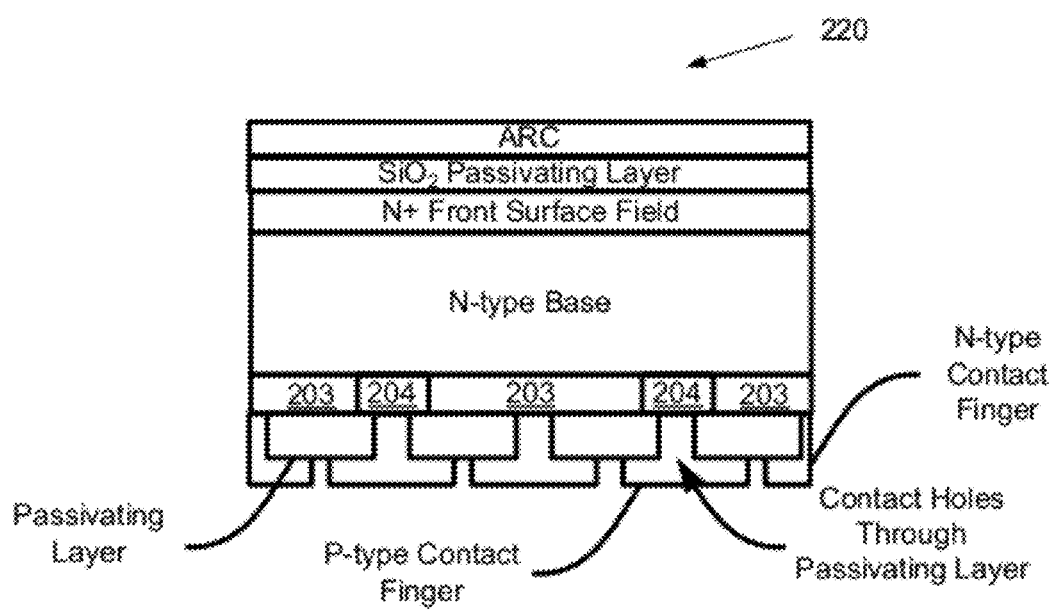
FIG. 2 is a cross-sectional view of an interdigitated back contact solar cell.
Figure 3:
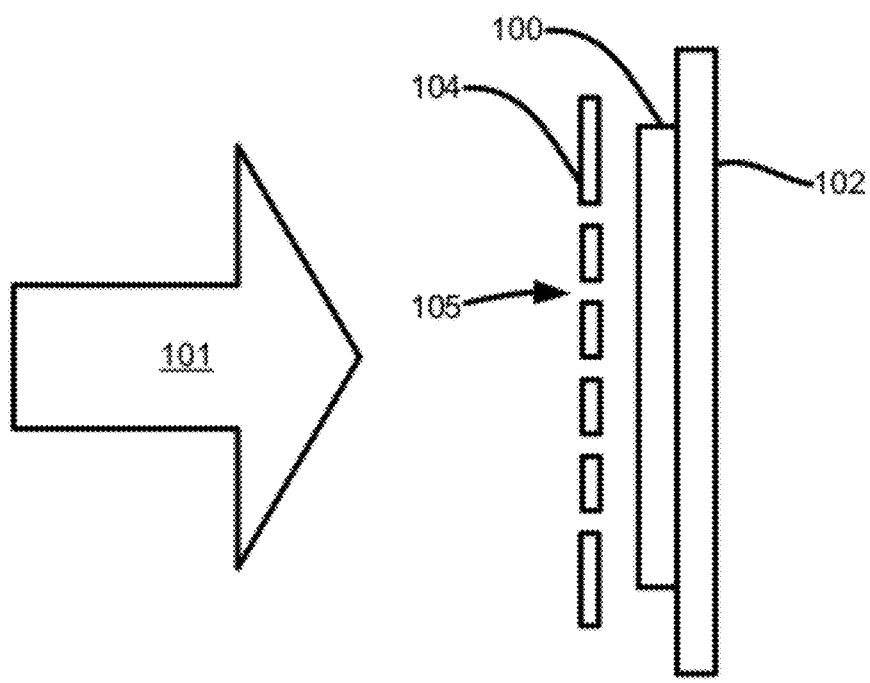
FIG. 3 is a cross-sectional view of implantation through a mask.

FIG. 3 is a cross-sectional view of implantation through a mask. When a specific pattern of ion implantation in a substrate 100 is desired, a mask 104 may be used. This mask 104 may be a shadow or proximity mask. The mask 104 is placed in front of a substrate 100 in the path of an ion beam 101. The substrate 100 may be, for example, a solar cell. The substrate 100 may be placed on a platen 102, which may use electrostatic or physical force to retain the substrate 100. The mask 104 has apertures 105 that correspond to the desired pattern of ion implantation in the substrate 100. The apertures 105 may be stripes, dots, or other shapes. Use of the mask 104 eliminates process steps, such as silkscreening or lithography, required for other ion implantation techniques.

In some embodiments, the system comprises a platen, which is attached to a workpiece support, capable of tilting about an axis. In the case of a scanned ion beam, the workpiece support may also be translated axially. The platen typically contains a type of mechanism to hold the substrate, such as an electrostatic chuck, or mechanic means. In addition, the system includes a proximity mask, such as a shadow mask, which is placed between the ion beam and the substrate. The shadow mask may be aligned to the substrate through the use of precision locating features.

Figure 4A:
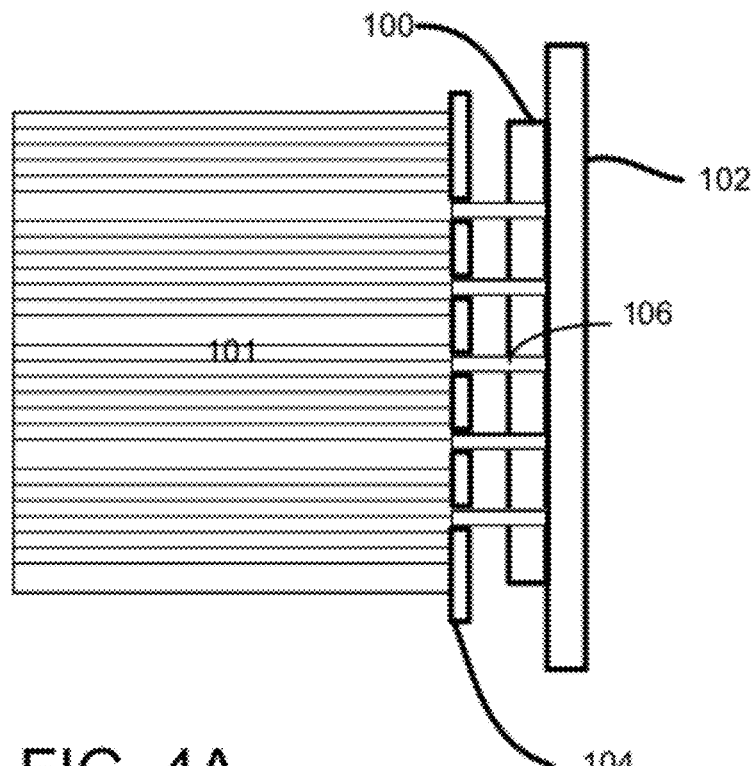
FIGS. 4A-C illustrate cross-sectional views of a substrate being implanted at various tilt angles.
Figure 4B:
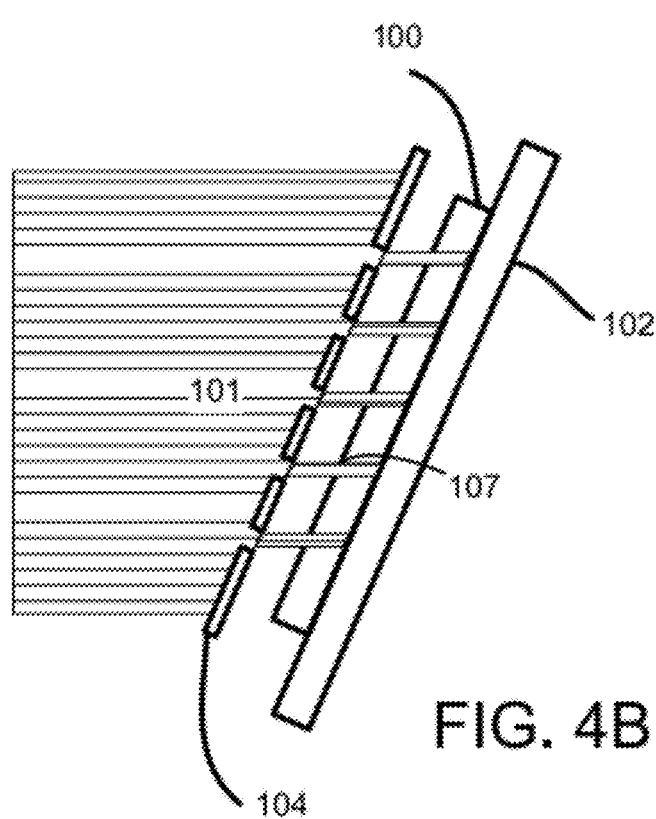
Figure 4C:
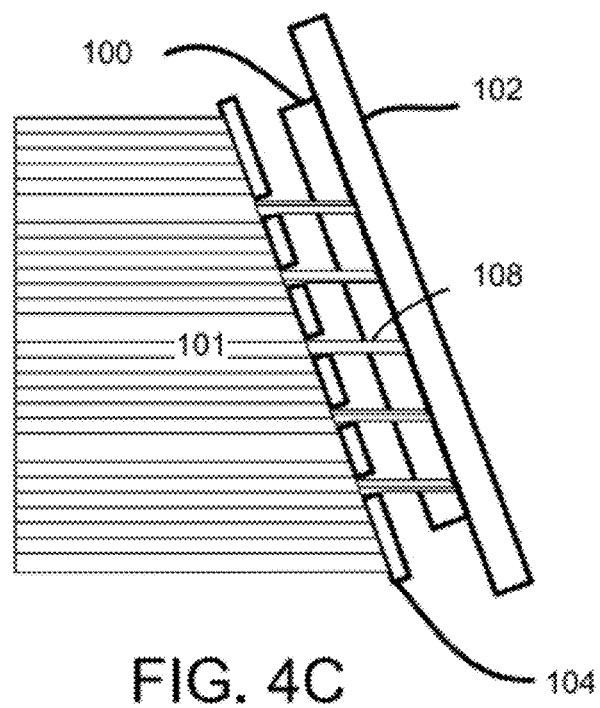

As shown in FIGS. 4A-C, by tilting the mask 104 and the substrate 100 relative to the ion beam 101, the region of the substrate 100 that is exposed to the ion beam 101 can be modified. FIG. 4a shows a substrate 100 and mask 104 which are held orthogonal to the ion beam 101. In this embodiment, regions 106 are implanted by the ion beam 101. FIG. 4b shows the substrate 100 and mask 104 of FIG. 4a being tilted in one rotational direction (i.e. clockwise) relative to the ion beam 101. In this case, the implanted regions 107 are offset from previously implanted regions 106. In this embodiment, the implanted regions 106 are moved vertically upward, as compared to implanted regions 106. Similarly, FIG. 4c shows the substrate 100 and mask 104 of FIG. 4a being tilted in another rotational direction (i.e. counterclockwise) relative to the ion beam 101. In this case, the implanted regions 108 are vertically offset from previously implanted regions 106, in the downward direction.

Figure 5:
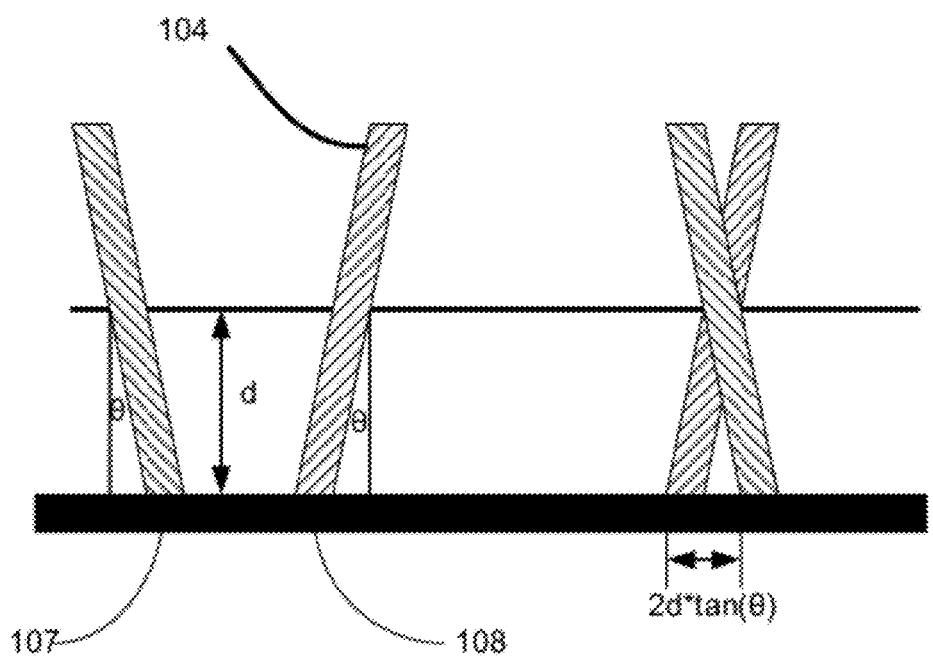
FIG. 5 illustrates the offset in the implanted region caused by tilting the mask and substrate relative to the ion beam.

As shown in FIG. 5, the amount of offset of regions 107, 108 from the normal implanted regions 106 is determined by several criteria. First, the angle of the tilt ($\theta$) affects this offset. For purposes of this disclosure, tilt angle will be measured using the direction orthogonal to the substrate as the reference (i.e. 0°). The distance (d) between the mask 104 and substrate 100 also impact this offset. In the case of a theoretical flat planar mask, the offset of the regions 107,108 from the normal implanted regions 106 can be expressed as $d \cdot \tan(\theta)$. If one implant is performed while the mask 104 and substrate is tilted by 0° in the clockwise direction, and a second implant is performed while the mask 104 and substrate 100 is tilted by 0° in the counterclockwise direction, the spacing between these two implanted regions 107,108 is given by $2d \cdot \tan(\theta)$. In some embodiments, the mask 104 has a thickness of about 2 mm with a gap of between 0 and 3 mm. In this embodiment, the maximum angle is limited by the thickness of the mask. For example, as the angle is increased, the thickness of the mask 104 begins to shrink the effective aperture. In some instances, the gap is made with a taper to reduce this effect, allowing the implants to be performed at tilt angles ($\theta$°) of up to 45°.

Figure 9:
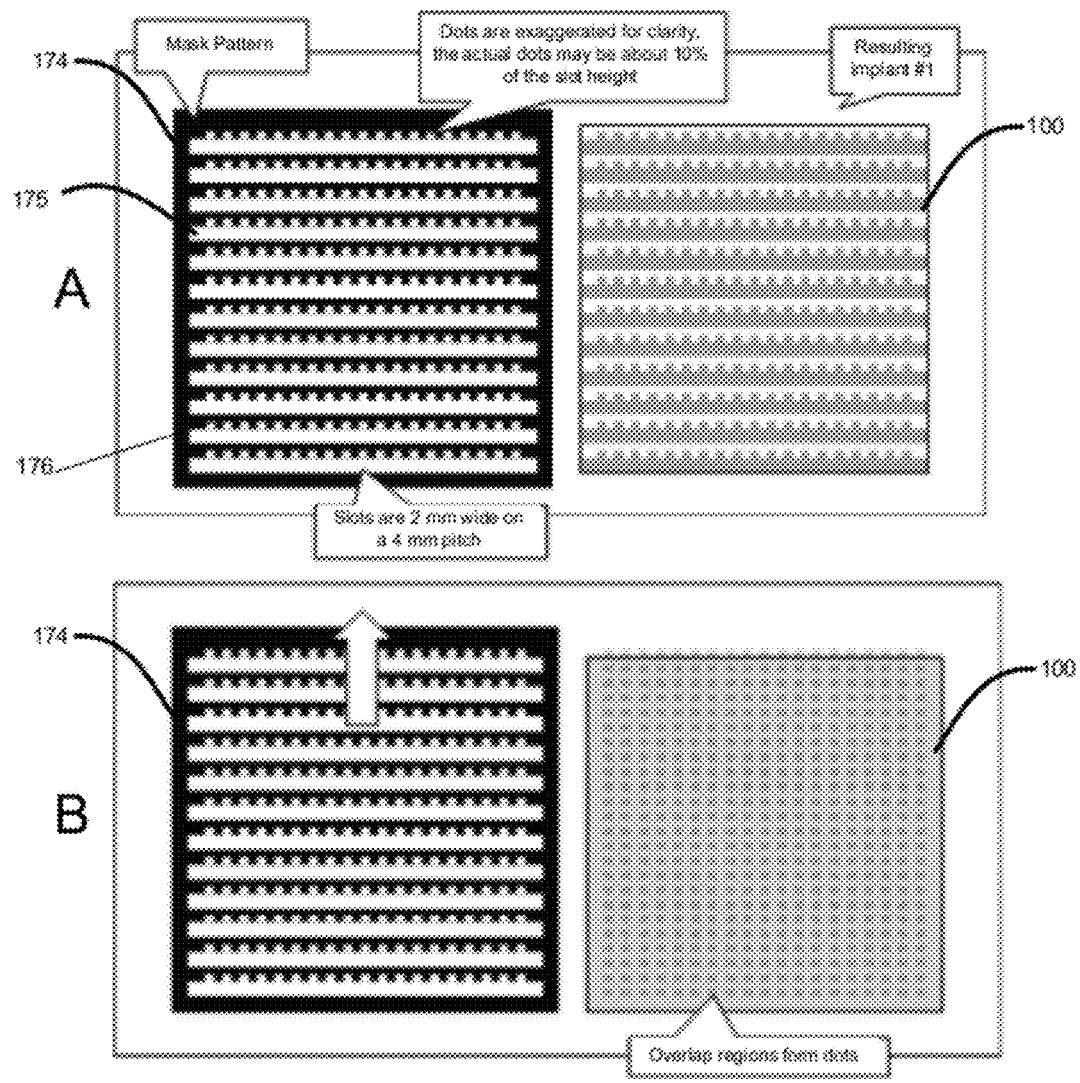
FIGS. 9A-B illustrate another mask that can be used in one embodiment.

The apertures in the mask 104 may be any shape, such as squares or rectangles. Other shapes, such as that shown in FIG. 9 can also be used. Each aperture is said to have a width (the horizontal dimension) and a height (vertical dimension). The size and shape of the aperture, the spacing between apertures, the tilt angle, the distance between the mask and the substrate, and the number of implant steps all contribute to determining the ultimate implant pattern.

Figure 6:
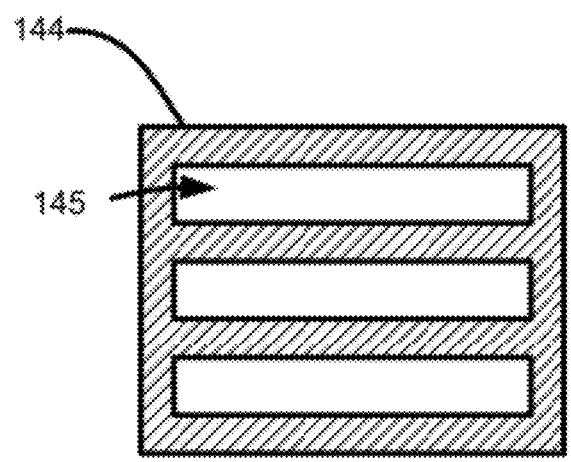
FIG. 6 is a front plan view of a segmented mask according to one embodiment.

FIG. 6 is a front plan view of a "single dose" mask 144. This mask can be used to implant a substrate 100 with a series of horizontal stripes through slots or apertures 145. Each implanted stripe will have the same dose, thus the term "single dose" mask. In some embodiments, it is desirable that portions of the substrate 100 be implanted twice, while other portions of the substrate 100 are implanted once. In addition, the width of the portion that is to be twice implanted may be thinner than aperture 145. The mask 144 is placed in alignment with the substrate, using locating or registration points. Once properly aligned, the mask maintains a fixed spatial relationship to the substrate, in which is remains offset from the front surface of the substrate by a fixed amount.

Figure 7A:
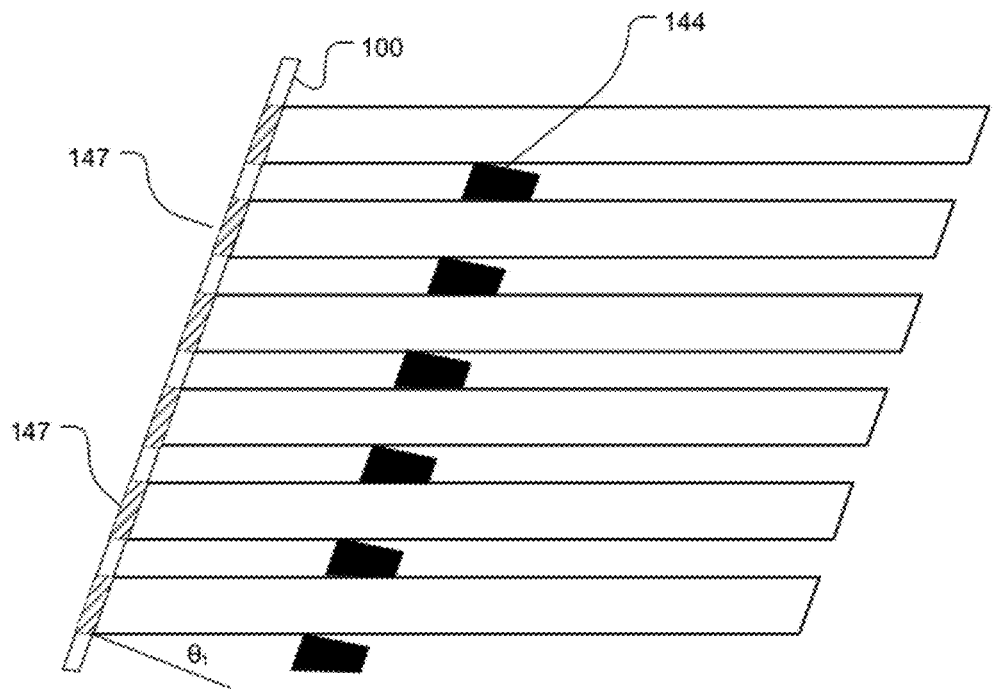
FIGS. 7A-B illustrate sequential scanning with the mask of FIG. 6.
Figure 7B:
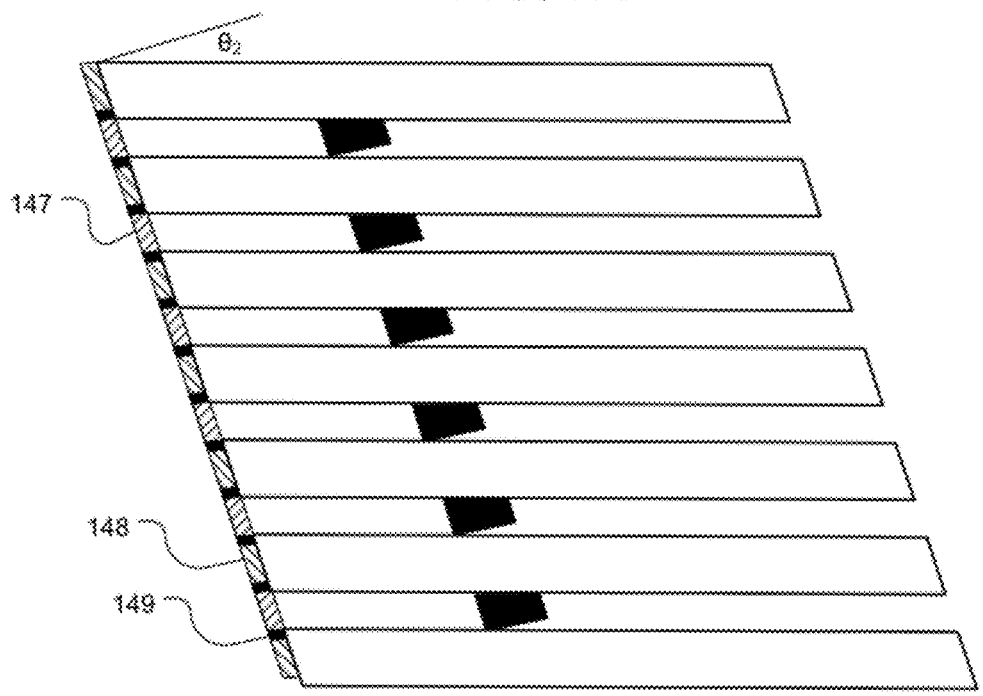

FIGS. 7A-B illustrate sequential scanning using the mask of FIG. 6. In FIGS. 7A-B, the mask 144 is illustrated in cross-section, and the implant of FIGS. 7A-B on the substrate 100 is shown on the substrate. The mask 144 and the substrate 100 are tilted at an angle $\theta_1$ relative to the ion beam. The substrate 100 is then exposed to the ion beam and regions 147 are implanted. After the first pass (FIG. 7A), the substrate 100 has an implanted region that resembles the mask 144. The mask 144 and substrate 100 are then rotated to a second tilt angle $\theta_2$ relative to the ion beam. This rotation is typically performed outside the ion beam, so that the substrate is not exposed to the ion beam during the rotation. In other embodiments, the beam angle is continuously varied to produce a smooth dose profile. In some embodiments, this angle is the opposite of the tilt angle used for the first implant. For example, if the mask is tilted 15° clockwise for the first implant, the second implant may be performed at a tilt angle of 15° counterclockwise. This change in tilt angle affects the portions of the substrate 100 which are implanted, as explained in FIG. 5. This two pass implant causes the substrate to have regions 147 implanted during the first pass, regions 148 implanted during the second pass, and regions 149 implanted during both passes. Note that this implant process creates regions 149 which are implanted twice, which are thinner than the width of the aperture 145 of the mask 144. In addition, the number of regions 149 is twice the number of apertures 145 in the mask 144. The tilt angle used is sufficient to insure that the portion of the substrate 100 directly beneath the mask (such as between apertures) is implanted during at least one of the implant steps. In one embodiment, the regions 149 may be between 50 and 500 micrometers. The width of the aperture may be approximately equal to the pitch (defined as the center to center spacing of regions 149) plus the desired width of regions 149, where the pitch is between 1 and 3 mm.

In one embodiment, the aperture is 2.85 mm at its narrowest point (at the side of the mask 144 closest to the substrate 100) and 3.95 mm at its widest point (at the side of the mask 144 furthest from the substrate 100). The width of the mask is approximately equal to the width of the apertures. The back side of the mask 144 may be approximately 4.4 m from the substrate 100. By performing two implants, one at 15° and the second at −15°, the region 149 will be approximately 500 μm and the pitch will be about 2.38 mm. Other embodiments are possible, where the width of the apertures, the gap between the mask and the substrate and the tilt angle may be varied as desired.

Figure 8:
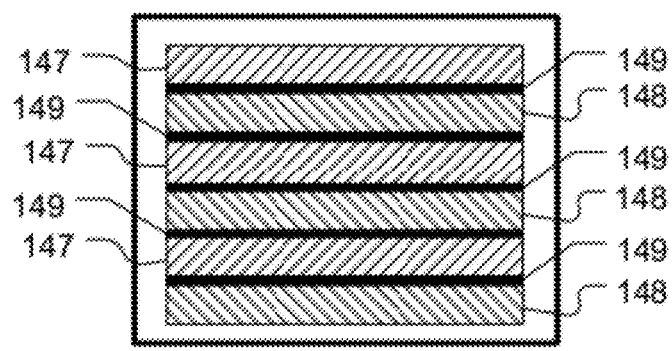
FIG. 8 is a front plan view of a substrate implanted using the sequential scanning of FIG. 7A-B.

FIG. 8 shows a top view of the substrate 100 implanted using mask 144 with the sequence illustrated in FIGS. 7A-B. As explained above, the entire surface of the substrate 100 is implanted with certain regions 147 implanted during the first pass, other regions 148 implanted during the second pass and some regions 149 implanted during both passes.

The stepped mask concept is not limited to masks with stripe-shaped apertures. FIGS. 9A-B are embodiments of a mask 174 with its resulting implant patterns. Many different patterns may be implanted into a substrate by designing a mask to create the appropriate overlap regions. Heavily dosed features may be made discrete and the pattern may be repeated to at least some extent. In the embodiment of FIGS. 9A-B, the mask 174 pattern creates a grid-like pattern on the substrate 100. The apertures 175 in this case have no overlap except for the small indentations 176.

These indentation areas 176 are implanted twice and form a grid on the substrate 100. FIG. 9B is the resulting implant pattern in the substrate 100 after the substrate 100 and mask 174 is tilted to a second angular position and implanted a second time. Some regions of the substrate 100 (i.e. the indentation areas) are implanted with a higher dose than other regions of the substrate 100.

The use of tilt angle to create two or more different implant patterns has several advantages. First, it requires less precise registration of the mask with the substrate, since all implants are done with the mask and the substrate kept in this alignment. In other words, the mask is never moved relative to the substrate, so all implants are referenced from a common point, thereby minimizing the precision required. In addition, the addition or removal of a mask can be executed quickly. Alternately, overlapping pattern may be created with separate masks. However, for each mask, the wafer needs to be positioned very accurately so that the regions overlap as intended. In addition, each of individual masks will be machined separately, so each introduces a new positional error. By using one mask with two tilt angles, the error introduced by either manufacturing or position the wafer is common to both implants, so it does not cause any overlapping errors.

The same principle may be applied to implant more regions with the same mask. This would allow smaller implanted pitch than would be otherwise manufacturable.

It may also be possible, in some embodiments, to perform the multiple implants simultaneously. For example, two different ion beams, each separately created, may be directed to the substrate 100 at a specific angular offset, can be used to perform both implants simultaneously, or at least partially simultaneously. In this embodiment, the species that are implanted by each ion beam may be different. The implant energy of the two ion beams may also be different. In another embodiment, a single ion beam is created, and is then split into two beams, such as by using optical or electrostatic means. These two ion beams are then directed toward the substrate at different implant angles. This may reduce the total processing time required to perform the implants in the substrate 100.

Figure 11A:
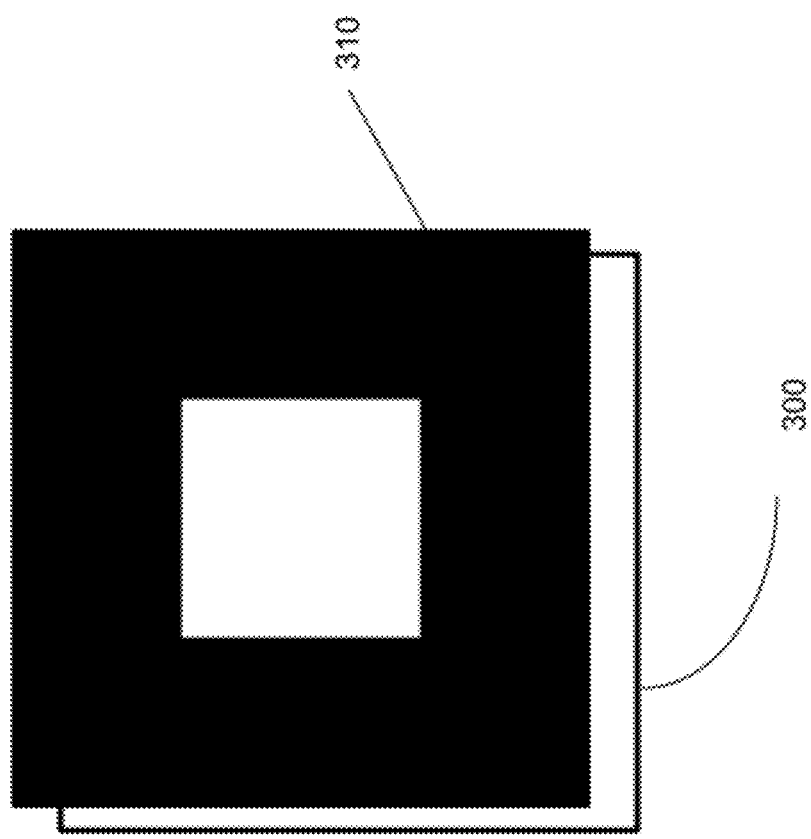
FIGS. 11A-B illustrate a mask used with two dimensional tilting.
Figure 11B:
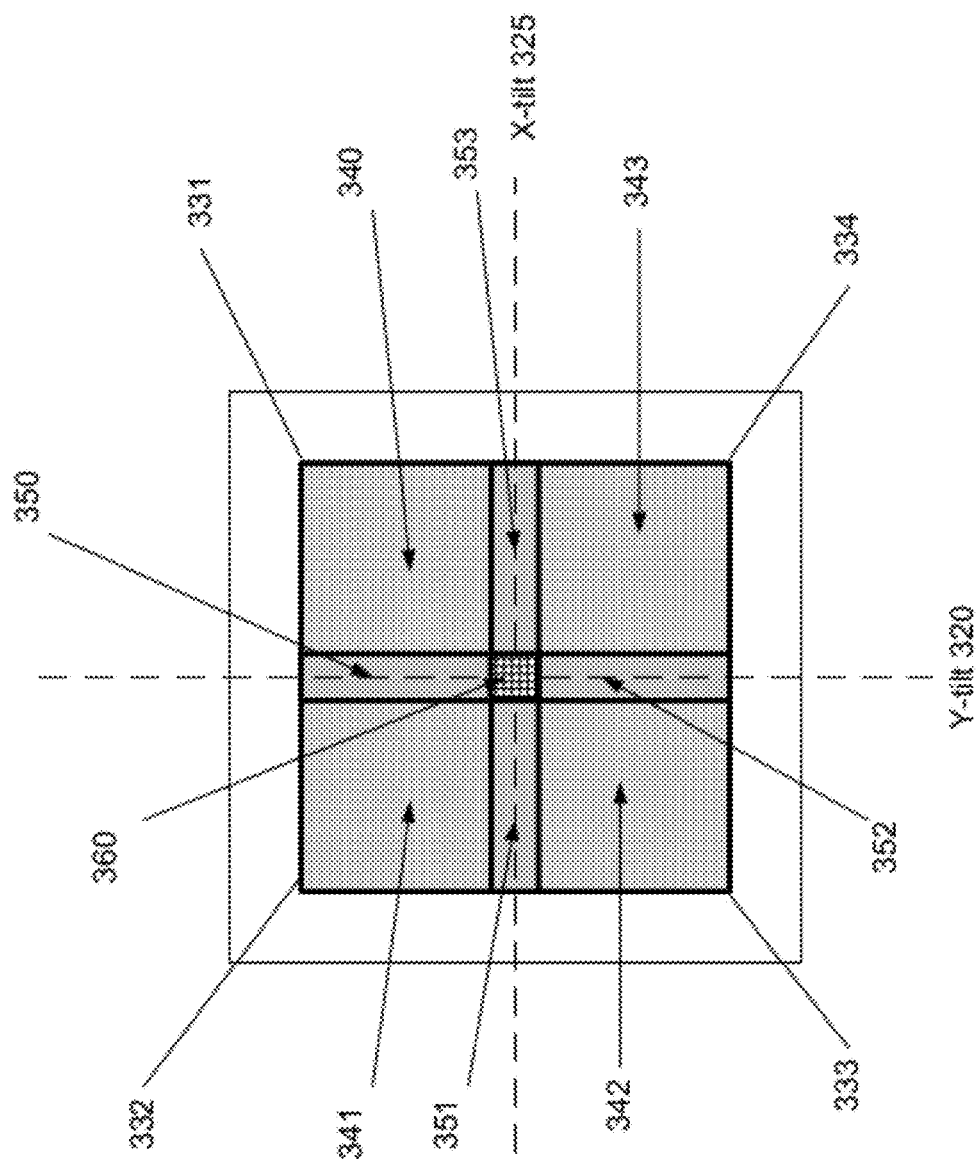

In another embodiment, the mask and substrate can be tilted along two axis, such as y-tilt and x-tilt. FIG. 11A shows a substrate 300 and a portion of a mask 310. This mask 310 represents a square, although other shapes are possible. Through the center of the substrate 300, a set of orthogonal axis 320, 325 are shown. FIG. 11B shows the implanted regions created by tilting the mask 310 and substrate 300 in various x-tilt and y-tilt angles.

When the mask 310 and substrate are tilted in the +x-tilt and +y-tilt directions (such that corner 331 is the lowest of the four corners), a first implant is performed. Because of the two dimensional tilt angle, the region 340 is implanted.

The mask 310 and the substrate 300 are then tilted in the +x-tilt and −y-tilt (such that corner 332 is the lowest of the four corners), and a second implant is performed. Thus causes region 341 to be implanted. Depending on the size of the aperture in the mask 310, and the tilt angle, a striped region 350, of varying width, may be implanted twice.

The mask 310 and the substrate 300 are then tilted in the −x-tilt and −y-tilt (such that corner 333 is the lowest of the four corners), and a third implant is performed. Thus causes region 342 to be implanted. Depending on the size of the aperture in the mask 310, and the tilt angle, a striped region 351, of varying width, may be implanted twice.

The mask 310 and the substrate 300 are then tilted in the −x-tilt and +y-tilt (such that corner 334 is the lowest of the four corners), and a fourth implant is performed. Thus causes region 343 to be implanted. Depending on the size of the aperture in the mask 310, and the tilt angle, a striped regions 352, 353 of varying width, may be implanted twice. In addition, depending on the size of the aperture and the tilt angles used, a region 360 may be implanted 4 times. Depending on the tilt angles, the striped regions 350, 352 may be a different width than striped regions 351, 353.

Figure 10A:
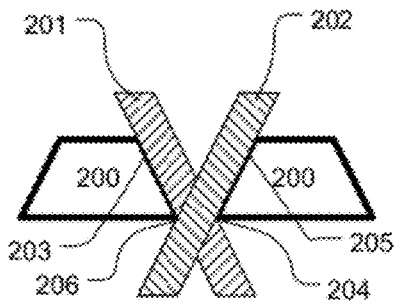
FIGS. 10A-E illustrate masks of various cross-sections.

The cross-section of the mask can also be used to affect the implant pattern. FIG. 10 shows a variety of different cross-sections that can be used. In each example, the mask is between 2 and 6 mm in thickness, and allows for tilt angles up to 45°. In FIG. 10A, a trapezoidal shape is used to form the ion beams that pass through the mask 200. The width of the ion beam 201 is based on the relative positions of side 203 and point 204. Similarly, the width of ion beam 202 is based on the relative positions of side 205 and point 206. This embodiment illustrates a mask 200 having a cross-section which is a regular trapezoid (i.e. the non-parallel sides are congruent and the angles between these sides and the base are equal). This configuration creates two implants, where the beamlets 201, 202 that are passed through the apertures are equal in width and are of opposite angles (i.e. +θ and −θ). Other shapes and configurations of cross-sections can be used to create a system whereby a side on one side of the aperture and a point on the opposite side of the aperture are used to define the beam width and angle in both directions.

Figure 10B:
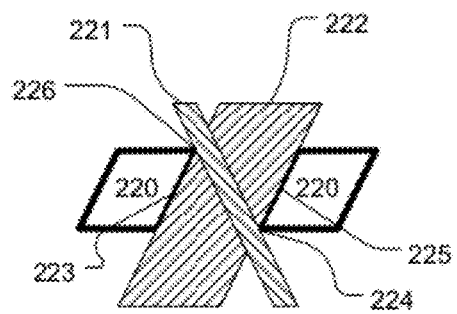

FIG. 10B shows a mask 220 with a cross section which is a parallelogram. In this embodiment, the width of the ion beam 221 is based on the relative positions of point 226 and point 224. The width of ion beam 222 is based on the relative positions of side 225 and side 223. Thus, by varying the width of the aperture, and the slope of sides 223, 225, an implant pattern can be created whereby the width of one of the beamlets 221, 222 is wider than the other beamlet. The slope of parallel sides 223, 225 determines the appropriate tilt angle in one direction. The spacing between points 224, 226 determines the appropriate tilt angle in the other direction. Thus, this configuration allows for varying tilt angles, where the beams implanted during each pass are of different width. Other shapes and configurations of cross-sections can be used to create a system whereby sides on either side of the aperture are used to define the beam width and angle in one direction, while points on either side of the aperture are used to define the beam width and angle in the other direction.

In one embodiment, the same mask can be used for both the p-type and n-type implant for an IBC solar cell. Since the pattern of the mask is identical in each step, there would be no mechanical tolerance variations. In this instance, it may be beneficial to have different ion beam widths for each of the regions.

Figure 10C:
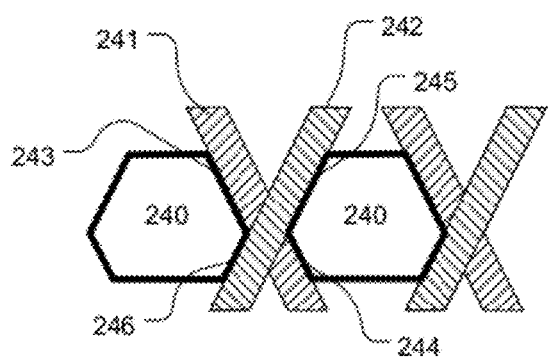

Other shaped cross-sections, with varying numbers of sides, can also be utilized. FIG. 10C shows a hexagonal cross-section 240. In this embodiment, the width of the ion beam 241 is based on the relative positions of side 243 and side 244. The width of ion beam 242 is based on the relative positions of side 245 and side 246. The slope of parallel sides 243, 244 determines the appropriate tilt angle in one direction. The spacing between sides 245, 246 determines the appropriate tilt angle in the other direction. By varying the width of the aperture and the slopes of sides 243-246, the appropriate tilt angles and widths of the ion beamlets 241, 242 can be adjusted. Other shapes and configurations of cross-sections can be used to create a system whereby sides on either side of the aperture are used to define the beam width and angle in both directions.

Figure 10D:
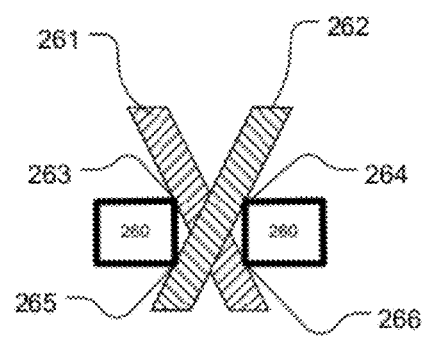

FIG. 10D shows a mask 260 having a rectangular cross-section. In this embodiment, the spacing between points 224, 226 determines the tilt angle and beam width in one direction. The spacing between points 223, 225 determines the tilt angle and beam width in the other direction. This configuration is best suitable for implants where the beam widths are the same, and the tilt angle are opposites. Other shapes and configurations of cross-sections can be used to create a system whereby points on either side of the aperture are used to define the beam width and angle in both directions.

Figure 10E:
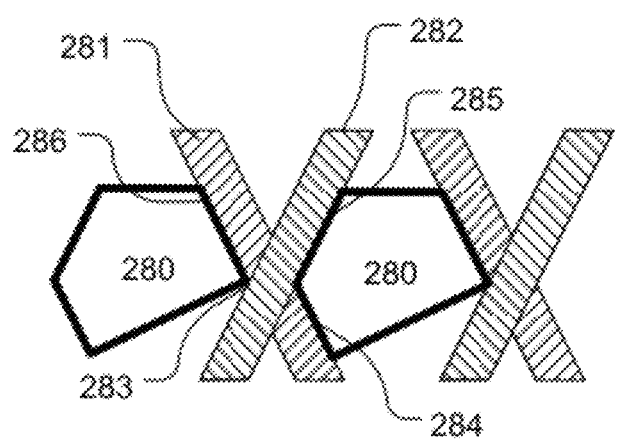

FIG. 10E shows a mask 280 having a pentagonal cross-section. In this embodiment, the spacing between point 283 and side 284 determine the tilt angle and beam width in one direction. The spacing and slope of sides 284, 286 determine the tilt angle and beam width in the other direction. Other shapes and configurations of cross-sections can be used to create a system whereby sides on either side of the aperture are used to define the beam width and angle in one direction, while a point and a side are used in the other direction.

In other embodiments, the implant sequence can be modified to allow for additional tilt angles. For example, returning to FIG. 7A-B, there may be a third scan, in which the substrate 100 is held orthogonal to the ion beam (i.e. 0° tilt angle).

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of implanting a pattern into a substrate, comprising:
    placing a mask, having at least one aperture, in a path of an ion beam between said substrate and an ion source, wherein said mask has a fixed spatial relationship to said substrate;
    rotating said substrate at a first tilt angle relative to said ion beam;
    exposing said substrate to said ion beam at a first tilt angle while maintaining said fixed spatial relationship between said substrate and said mask, thereby implanting ions in a first region of said substrate aligned with said aperture when tilted at said first tilt angle;
    rotating said substrate and said mask at a second tilt angle relative to said ion beam; and
    exposing said substrate to said ion beam at a second tilt angle while maintaining said fixed spatial relationship between said substrate and said mask, thereby implanting ions in a second region of said substrate, aligned with said aperture when tilted at said second tilt angle;
    whereby a portion of said first region and a portion of said second region overlap, creating a heavily implanted third region, the third region having a higher implant dose than the first region and a second region outside of the third region.

2. The method of claim 1, wherein said mask comprises a plurality of said apertures that are rectangular and said substrate is rotated relative to said ion beam so as to create a plurality of differently implanted stripes.

3. The method of claim 1, wherein said substrate is rotated relative to said ion beam when said substrate is not exposed to said ion beam.

4. The method of claim 1, wherein said mask comprises a plurality of said apertures that are rectangular and have a space between adjacent pairs of said apertures, and wherein said substrate is rotated such that a region of said substrate beneath said space between adjacent pairs of apertures is exposed to said ion beam.

5. The method of claim 4, wherein said aperture comprises indentations extending from at least one of a top or a bottom of each of said apertures, said substrate is rotated relative to said ion beam so as to create a grid having said heavily implanted regions.

6. The method of claim 1, wherein said first region is larger than said second region.

7. The method of claim 1, wherein said first tilt angle is a rotation of an angular offset from orthogonal with respect to a surface of said substrate in one direction and said second tilt is the same angular offset in an opposite direction.

8. The method of claim 1, wherein said mask comprises a cross-sectional area, whereby said cross-sectional area determines a width of said ion beam passing through said aperture and determines a tilt angle of said ion beam during each implant.

9. The method of claim 8, wherein said cross-sectional area comprises a shape selected from the group consisting of a rectangle, trapezoid, parallelogram, pentagon and a hexagonal.

10. A method of implanting a pattern into a substrate, comprising:
    placing a mask, having at least one aperture, in the path of an ion beam between said substrate and an ion source, wherein said mask has a fixed spatial relationship to said substrate; and
    exposing said substrate to a first ion beam, at a first angle relative to orthogonal with respect to a surface of said substrate, and a second ion beam, at a second angle relative to orthogonal, thereby implanting ions in a first region of said substrate aligned with said aperture with said first ion beam and implanting ions in a second region of said substrate, aligned with said aperture with said second ion beam wherein said fixed spatial relationship between said mask and said substrate is maintained during the exposing said substrate to said first and second ion beams;

whereby a portion of said first region and a portion of said second region overlap, creating a heavily implanted region.

* * * * *